United States Patent [19]

Selna

[11] Patent Number: 5,833,471
[45] Date of Patent: Nov. 10, 1998

[54] HOLD-DOWN COLLAR FOR ATTACHMENT OF IC SUBSTRATES AND ELASTOMERIC MATERIAL TO PCBS

[75] Inventor: Erich H. Selna, Mountain View, Calif.

[73] Assignee: Sun Microsystems, Inc., Mountain View, Calif.

[21] Appl. No.: 664,931

[22] Filed: Jun. 11, 1996

[51] Int. Cl.$^6$ .................................................. H01R 9/09
[52] U.S. Cl. .................................................................. 439/73
[58] Field of Search .............................. 439/71, 72, 73, 439/330

[56] References Cited

U.S. PATENT DOCUMENTS

| | | | |
|---|---|---|---|
| 3,885,173 | 5/1975 | Lee | 439/71 X |
| 4,144,648 | 3/1979 | Grovender. | |
| 4,422,728 | 12/1983 | Andreaggi | 350/334 |
| 4,641,176 | 2/1987 | Keryhuel et al. | 439/72 X |
| 5,175,410 | 12/1992 | Freedman et al. | 219/121.63 |
| 5,216,583 | 6/1993 | Katsumata | 439/71 X |
| 5,379,188 | 1/1995 | Winslow | 439/72 X |

FOREIGN PATENT DOCUMENTS

| | | |
|---|---|---|
| 97109505 | 10/1997 | European Pat. Off.. |
| 37 01 310 A | 7/1988 | Germany. |
| 04 098219 A | 3/1992 | Japan. |

*Primary Examiner*—Neil Abrams
*Assistant Examiner*—Daniel Wittlels
*Attorney, Agent, or Firm*—Julian Caplan; Flehr Hohbach Test Albritton & Herbert LLP

[57] ABSTRACT

A land grid array package or a ball grid array package is electrically connected by an elastomeric type layer (containing alternating elements of conductive and non-conductive silicone) to a printed wire board or motherboard. A hold-down collar engages the peripheral edges of the package and snaps into holes in the board in such manner as to create pressure on the elastomeric layer, causing the layer to compress and create through-going electrical paths between exposed lands or conductive elements on the bottom of the package and exposed conductive elements on the wiring board. In one embodiment, solder balls adhere to the exposed conductive elements on the bottom of the package. In this embodiment the collar is initially in two pieces which are fitted together to engage both the top and bottom edges of the substrate.

12 Claims, 3 Drawing Sheets

HOLD-DOWN COLLAR FOR ATTACHMENT OF IC SUBSTRATES AND ELASTOMERIC MATERIAL TO PCBS

BACKGROUND OF THE INVENTION

1. Field of the Invention

This invention relates to a new and improved detachable means for connecting IC substrates to printed wire boards wherein an elastomeric layer of material is interposed and a hold-down collar compresses the elastomeric material so that conductive elements therein interconnect lands on the substrate with lands on the board.

2. Description of Related Art

Heretofore very expensive and complicated means have been employed to accomplish the purpose of the present invention. The present invention employs a commercially available soft elastomeric layer having alternating vertical elements of conductive and nonconductive material. Such material has been used to provide redundant contact from a chip carrier to a PCB or other wire board but the product has never been used in accordance with the present invention.

SUMMARY OF THE INVENTION

Packages using inexpensive chips normally are soldered to a printed wire board. When changing a chip is required, major reworking of the board is necessary and usually this cannot be done in the field. Hence it is desirable, particularly for expensive chips, to provide means for removing one package and replacing it with another.

The systems heretofore used for such replacement employ sockets which impart considerable force to the substrate to the hold it in place and hence the devices are large, complex and expensive. Furthermore, such sockets interfere with the use of heat sinks on top of the package.

In accordance with the present invention, a chip is mounted in a substrate having downward extending lands of electrically conductive material arranged in an array or pattern. A layer of a soft elastomeric material of particular specifications is positioned below the package. Such material has alternating vertical elements of conductive and nonconductive plastic or alternating elements of nonconductive plastic and metal therein. When the layer is compressed, the ends of the conductive elements both on the top and bottom of the layer become exposed and offer redundant connection to lands on the underside of the package and other lands on the upper surface of the printed wiring board arranged in an array aligned with the array on the substrate.

The present invention provides a collar having flanges which engage the edges of the package and having dependent legs fitting through holes in the elastomeric layer and also through holes in the board. Prongs are formed on the lower ends of the legs. By pushing downward on the collar until the prongs snap against the underside of the board to hold the assembly in place, the elastomeric material is compressed so that electrical connections are made between the lands on the package and the lands on the board.

When necessary, the collar may be disengaged in order to disconnect the package from the board so that a replacement may be installed.

One type of package used by this invention is a land grid array (LGA) wherein metallic lands are exposed below the surface of the package. Another type of array is a ball grid array (BGA) wherein minute balls of solder are attached to the lands on the underside of the package. The present invention accommodates both types of arrays.

Where a ball grid array is used, the collar grips both the upper and lower surface of the package. Hence the collar must be split and later fitted together in order to engage the package. For land grid array packages, a split collar is not necessary.

BRIEF DESCRIPTION OF THE DRAWINGS

The accompanying drawings, which are incorporated in and form a part of this specification, illustrate embodiments of the invention and, together with the description serve to explain the principles of the invention.

DETAILED DESCRIPTION OF THE PREFERRED EMBODIMENT

Figure 1:
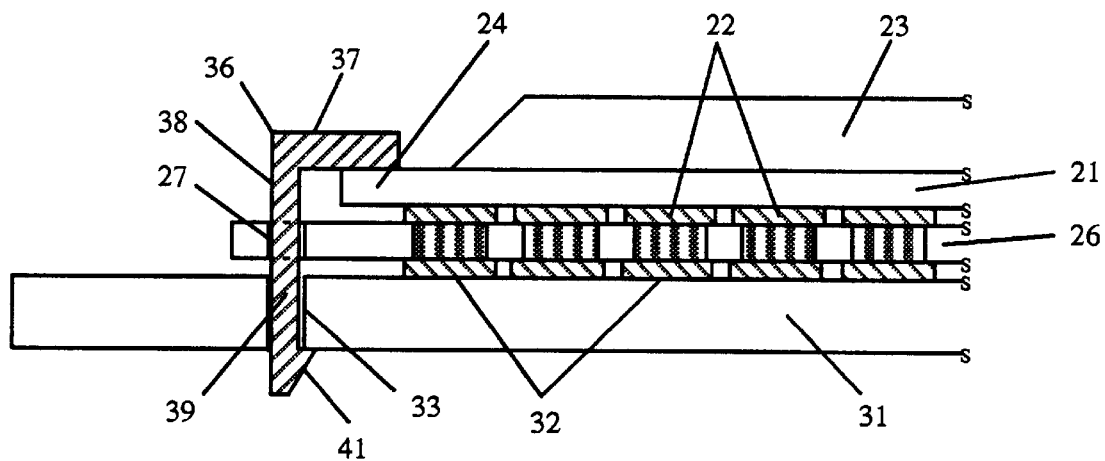
FIG. 1 is a greatly enlarged vertical sectional view through a portion of the package elastomeric layer, printed wire board and collar of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

An IC package 21 may be of various constructions. Essentially it consists of a substrate 21 having an array of lands 22 on the underside thereof, such lands being exposed approximately circular conductive elements of about 26 mil dia. about 1.4 mil thick. Various forms of encapsulation 23 are used to protect the package. The marginal edges 24 of the package are exposed.

Beneath the package 21 is a thin soft elastomeric layer 26. Such a layer may be of a material produced by Elastomeric Technologies, Inc. of Hatboro, Pa., known as STAX or MOE. The STAX version is made of alternating vertical elements of conductive and nonconductive silicone, there typically being 200 to 250 elements per inch. Such material has been used to connect printed wiring boards to flex circuits, flat paneled displays, LCD displays and other PWBs, as well as in IC sockets. MOE (metal-on-elastomer) has metallic contact such as gold or nickel which are layered on skins of nonconductive plastic. These layers have also been used for redundant contact in board-to-board chip carrier, direct-to-board, and other applications requiring low resistance and close spacing. Holes 27 are formed adjacent to each corner of layer 26.

Beneath layer 26 is a printed wire board 31 such as a PCB, motherboard or the like. Board 31 has an array of lands 32 of conductive material exposed on its upper surface. Lands 32 are vertically aligned with lands 22. In accordance with the invention, four slots 33 are formed in the board in vertical alignment with the corners of package 21 and the holes 27 of layer 26.

Collar 36 is made of a strong, flexible plastic material in a shape slightly longer than package 21. It has top horizontal flanges 37 ("first in-turned flanges") to engage the margins of edges 24 of package 21. Vertical sides 38 extend below flanges 37 and at the corners of the collar 36 there are depending legs 39 corresponding in spacing to holes 27 and slots 33 having prongs 41 at their lower ends. The collar 36 is pushed downwardly, the legs 39 extending through the slots 33 until the prongs 41 snap under the lower surface of board 31, thereby detachably locking collar 36 in place. For such purpose slots 33 are at least as large as prongs 41 and are so located that, as prongs 41 enter slots 33, legs 39 are biased outward. When prongs 41 clear slots 33, legs 39 return to vertical position and prongs 41 underlie board 31, holding collar 36 attached to board 31. The dimensions of collar 36 are such that the space between the underside of flange 37 and the upper surface of prongs 31 is slightly less than the distance between the top surface of package 21 and the bottom surface of board 31. This results in compression of layer 26, causing the conductive materials therein to engage both lands 22 and 32, thereby establishing redundant electrical contact therebetween.

If necessary, the collar 36 may be removed, permitting replacement of package 21 with a different package without requiring major operation on the board 31.

Figure 2:
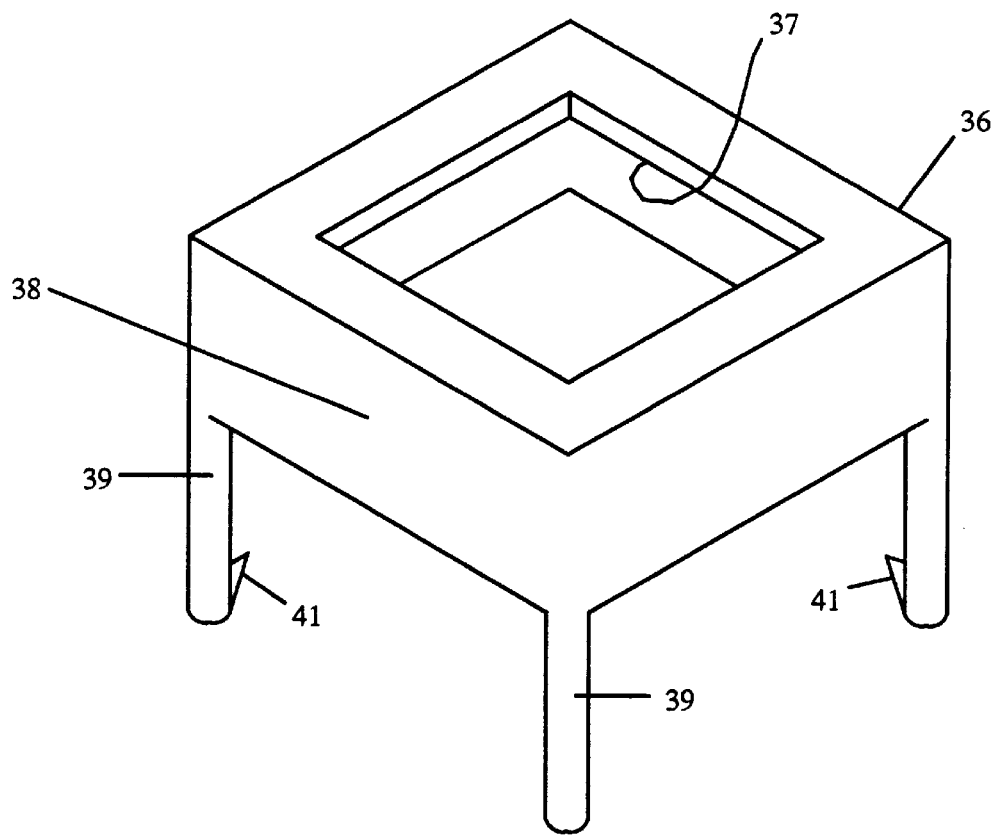
FIG. 2 is a further prospective view of a collar used with the structure of FIG. 1.
Figure 3:
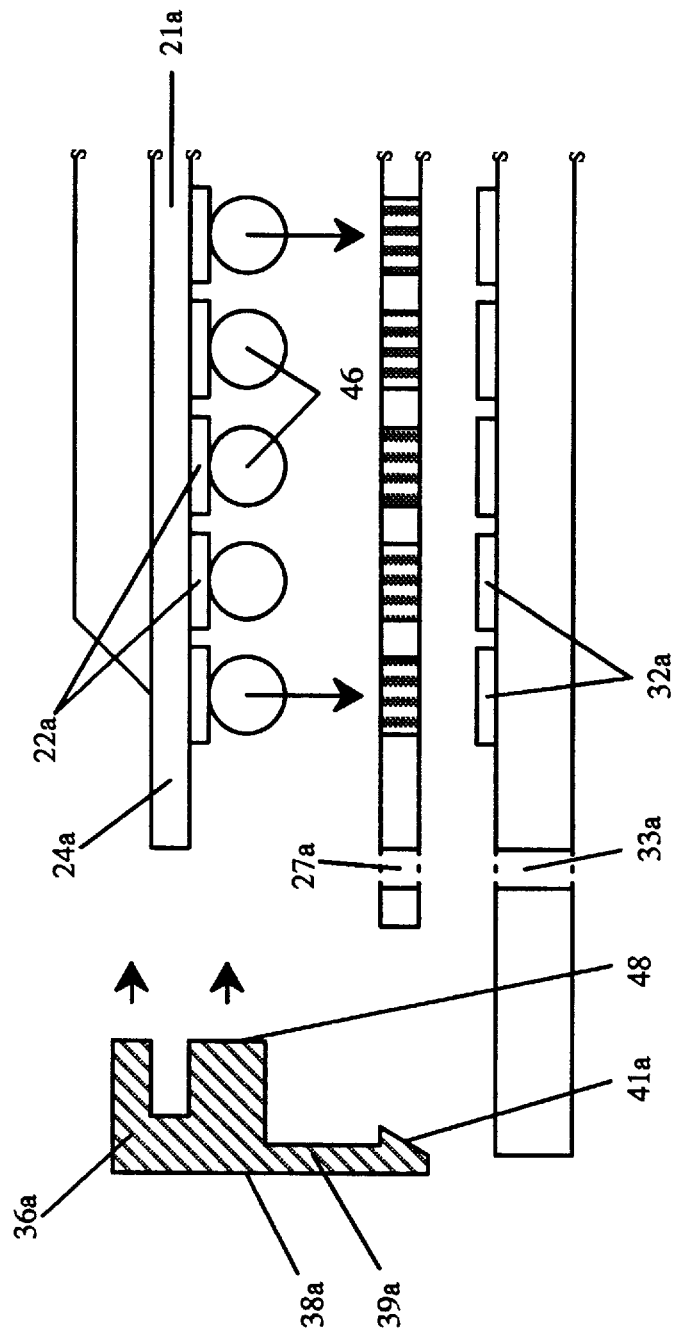
FIG. 3 shows a modified structure using balls of solder attached to lands on the underside of a BGA package prior to assembly.
Figure 4:
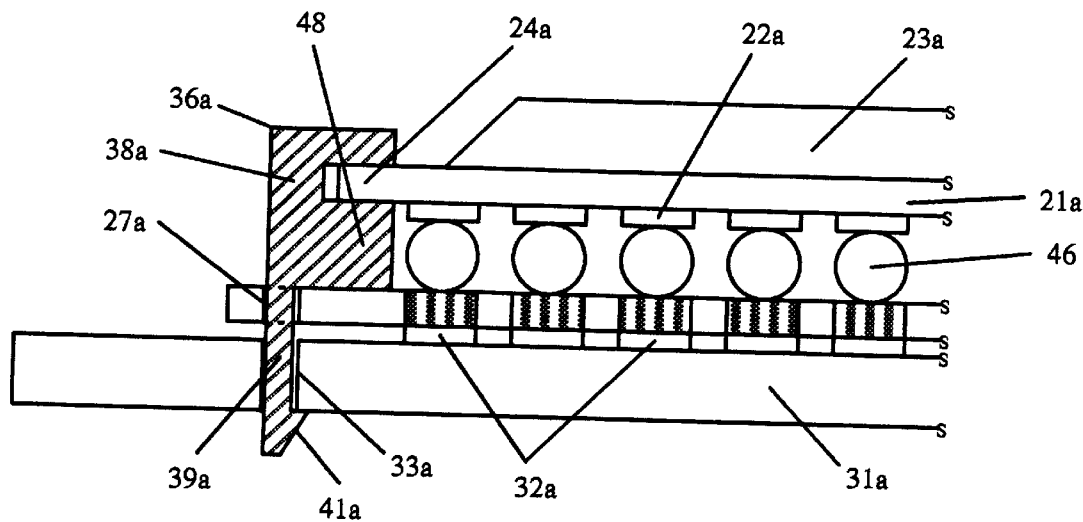
FIG. 4 is a sectional view showing the structure of FIG. 3 assembled.
Figure 5:
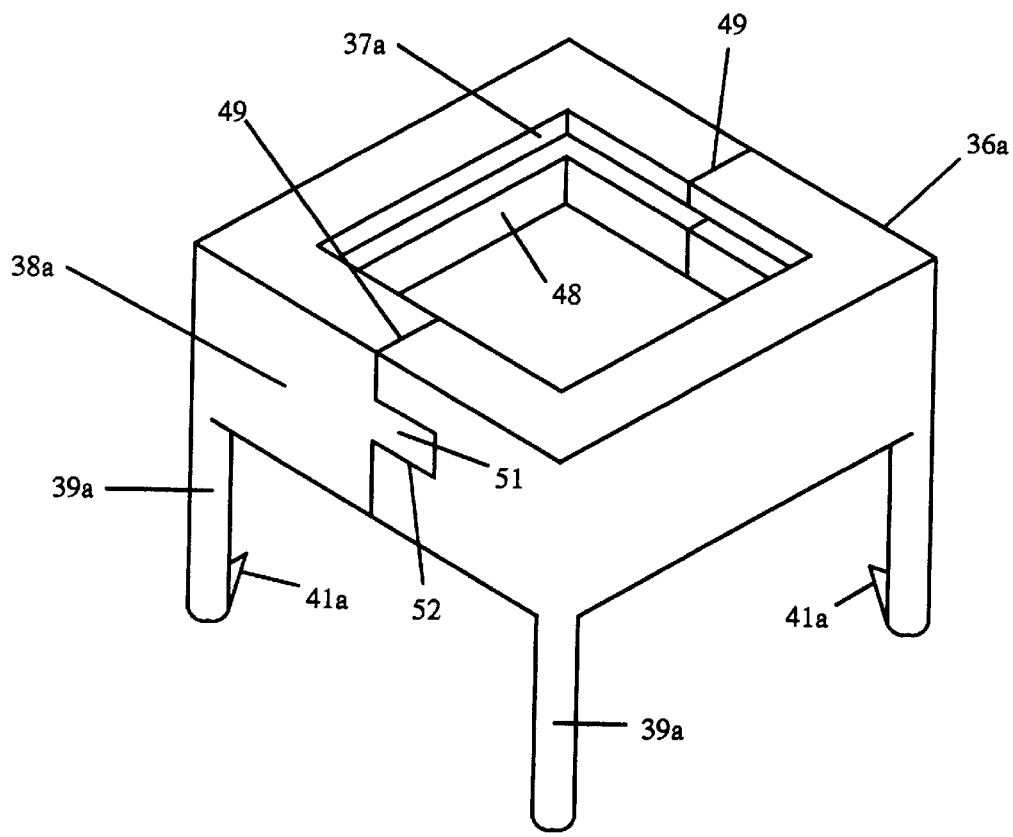
FIG. 5 is a view similar to FIG. 2 of a modified collar used with the structure of FIGS. 3 and 4.

Directing attention now to FIGS. 3–5, the package 21 is of the ball grid array type wherein minute balls of solder 46 (about 26 mil diameter) have been caused to adhere to the lands 22a on the underside of package 21a. In other respects the package 21a, layer 26a, and board 31a resemble those of the modification of FIG. 1. Collar 36a, however, is somewhat modified from the collar 36 of the preceding modification. A horizontal lower flange 48 ("second in-turned flanges") is formed below flange 37a. The spacing between flanges 37a and 48 is such that the edge 24a of package 21a is engaged. The thickness of flange 48 is slightly less than the distance between the underside of package 21a and the upper surface of layer 26a. In order to fit the collar 36a over the package 21a, it is best split. One form of split is best illustrated in FIG. 5A wherein there is a vertical parting line 49 through two sides of the collar 36a. To facilitate assembly thereof, tongues 51 in one half of the collar interlock into grooves 52 in the other half, as by a dovetail structure. After the collar 36a has been placed engaging the edges 24a, the two halves of the collar are suitably joined together either with or without use of an adhesive (use of an adhesive). In this embodiment, the lands 22a are in electrical engagement with the solder balls 46 which are in turn in engagement with the conductive stripes in the layer 26a. In the modification of FIGS. 1–2, a conductive member on the package comprises land 22; in the modifications of FIGS. 3–4 it comprises land 22a and ball 46.

In other respects, the modification of FIGS. 3–5 resembles that of FIGS. 1 and 2 in the same reference numerals followed by the subscript a are used to indicate corresponding parts.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. In combination an I-C package having an array of conductive members in a first array on a lower surface of said package and having peripheral top edges, a layer of soft elastomeric material formed with a plurality of conductive and non-conductive vertical elements beneath said package, a printed wire board below said layer having a plurality of conductive lands in a second array on an upper surface of said board, said board underlying said layer and being formed with hold-down collar engaging means, a hold-down collar having in-turned flanges engaging said top edges of said package, legs extending downward relative to said flanges and having board-engaging means cooperable with said collar-engaging means to apply downward force to said flanges and secure said collar to said board, said layer being formed with apertures, said legs passing through said apertures and thereby aligning said layer relative to said first array and said second array, said collar being vertically dimensioned so that when said collar is secured to said board said layer is compressed and conductive elements are exposed to establish electrical circuits between pluralities of said members and corresponding pluralities of said lands.

2. The combination of claim 1 in which said package comprises a substrate and encapsulating material on an upper surface of said substrate.

3. The combination of claim 1 in which said board engaging means comprise prongs on said legs and said collar engaging means comprise apertures in said board to receive said prongs.

4. The combination of claim 1 in which each said conductive member comprises a second land on the underside of said package and a ball of solder adhered to said second land.

5. The combination of claim 1 in which said collar comprises a vertical skirt depending from said flanges, said legs depending from said skirt.

6. The combination of claim 5 in which said package, said layer and said collar are substantially rectangular.

7. In combination an I-C package having an array of conductive members in a first array on a lower surface and having peripheral top edges, a layer of soft elastomeric material formed with a plurality of conductive and non-conductive vertical elements beneath said package, a printed wire board below said layer having a plurality of conductive lands in a second array on an upper surface of said board, said board underlying said layer and being formed with hold-down collar engaging means, a hold-down collar having first in-turned flanges engaging said top edges of said package, legs extending downward relative to said flanges and having board-engaging means cooperable with said collar-engaging means to apply downward force to said flanges and secure said collar to said board, said collar being vertically dimensioned so that when said collar is secured to said board said layer is compressed and conductive elements are exposed to establish electrical circuits between pluralities of said members and corresponding pluralities of said lands, said collar further comprising second in-turned flanges spaced below said first in-turned flanges a distance substantially equal to the thickness of said package at said top edges, said collar being initially formed in at least two pieces and re-assembled together surrounding said package, said first-mentioned flanges engaging said package above said top edges and said second flanges engaging the bottom of said package.

8. The combination of claim 7 in which said second in-turned flanges have a thickness less than the distance between the underside of said package and the upper surface of said layer.

9. A hold-down collar for attaching an I-C package and an underlying layer of elastomeric material to a printed wire board comprising a first in-turned flange, legs extending downward relative to said flange and printed wire board engaging means on said legs, a second in-turned flange spaced below said first flange, said collar being initially formed in at least two pieces and re-assembled together.

10. A collar according to claim 9 which further comprises a vertical skirt depending from said flange, said legs depending from said flange, said legs depending from said skirt.

11. A collar according to claim 9 in which said board engaging means comprises prongs adjacent lower ends of said legs.

12. A collar according to claim 9 in which said flange is substantially rectangular and horizontal.

* * * * *